US008822026B2

(12) United States Patent
Miller

(10) Patent No.: US 8,822,026 B2
(45) Date of Patent: Sep. 2, 2014

(54) CARBON NANOTUBE TRANSPARENT FILMS

(71) Applicant: Empire Technology Development, LLC, Wilmington, DE (US)

(72) Inventor: Seth Adrian Miller, Longmont, CO (US)

(73) Assignee: Emprie Technology Development LLC, Wilmington, DE (US)

( * ) Notice: Subject to any disclaimer, the term of this patent is extended or adjusted under 35 U.S.C. 154(b) by 0 days.

(21) Appl. No.: 13/857,874

(22) Filed: Apr. 5, 2013

(65) Prior Publication Data

US 2013/0269770 A1 Oct. 17, 2013

Related U.S. Application Data

(62) Division of application No. 12/503,619, filed on Jul. 15, 2009, now Pat. No. 8,435,595.

(51) Int. Cl.
*H01B 13/00* (2006.01)
*B82Y 35/00* (2011.01)

(52) U.S. Cl.
USPC ........... 428/331; 428/323; 428/364; 428/367; 977/700; 977/742; 977/842

(58) Field of Classification Search
CPC combination set(s) only.
See application file for complete search history.

(56) References Cited

U.S. PATENT DOCUMENTS

| 7,045,205 | B1 | 5/2006 | Sager |
| 2001/0044251 | A1 | 11/2001 | Cho et al. |
| 2003/0030037 | A1 | 2/2003 | Takamiya et al. |
| 2003/0165418 | A1* | 9/2003 | Ajayan et al. ............. 423/447.2 |
| 2003/0211029 | A1 | 11/2003 | Someya et al. |
| 2006/0113510 | A1* | 6/2006 | Luo et al. ............. 252/500 |
| 2007/0119498 | A1* | 5/2007 | Park et al. ............. 136/256 |
| 2008/0118634 | A1 | 5/2008 | Wei et al. |
| 2010/0098902 | A1 | 4/2010 | Kotov et al. |

OTHER PUBLICATIONS

Liu et al., "Decoration of Carbon Nanotubes with Chitosan", Carbon, vol. 43, (2005), pp. 3178-3180.*
"SNOWTEX," Nissan Chemicals, (no date available).
Ajayan, "How does a Nonofibre Grow?", Nature, Jan. 29, 2004, pp. 402-403, vol. 427 No. 29.
Hone, J. et al., "Growth of Nanotubes and Chemical Sensors Applications," Center of Electric Transport in Molecular Structures, 2004, Columbia University, NY NY.
Hu, L. et al., "Percolation in Transparent and Conducting Carbon Nanotube Networks," Nano Letters, 2004, pp. 2513-2517, vol. 4 No. 12.
Palumbo, et al., "Layer-by-Layer Thin Films of Carbon Nanotubes," Materials Research Society Symposium Proceedings, 2006, vol. 901E.
Wang, et al., "Directed Assembly of Nanowires," Materials Today, May 2009, pp. 34-43, vol. 12 No. 5.

(Continued)

*Primary Examiner* — Michael Cleveland
*Assistant Examiner* — Lisha Jiang
(74) *Attorney, Agent, or Firm* — Dorsey & Whitney LLP

(57) ABSTRACT

The present disclosure generally relates to conductive films and methods for forming conductive films. In some examples, a substrate may be provided having a dispersion of silica nanoparticles provided on a surface thereof. Carbon nanotubes may be adhered to the dispersion of silica nanoparticles on the surface of the substrate to provide the conductive film on the substrate.

24 Claims, 5 Drawing Sheets

(56) References Cited

OTHER PUBLICATIONS

Zhang, Daihua et al., "Transparent, Conductive, and Flexible Carbon Nanotube Films and Their Application in Organic Light-Emitting Diodes," Nano Letters, 2006, pp. 1880-1886, vol. 6 No. 9.

Zhang, Meining et al., "Electrostatic Layer-by-Layer Assembled Carbon Nanotube Multilayer Film and Its Electrocatalytic Activity for O2 Reduction," Langmuir, 2004, pp. 8781-8785, vol. 20.

Zheng, Feng et al., "Carbon Nanotube Synthesis Using Mesoporous Silica Templates," Nano Letters, 2002, pp. 729-732, vol. 2 No. 7.

* cited by examiner

CARBON NANOTUBE TRANSPARENT FILMS

CROSS-REFERENCE TO RELATED APPLICATIONS

This application is a divisional of U.S. application Ser. No. 12/503,619 (now U.S. Pat. No. 8,435,595), filed on Jul. 15, 2009, which is incorporated, herein by reference, in its entirety, and for any purpose.

BACKGROUND

Generally, transparent conducting films (also referred to as transparent films) have been used for substrates of electronic displaying elements such as a liquid crystal displaying element, an organic electroluminescent element, a plasma display, an electronic paper, an electronic optical element, a solar cell substrate and so forth. The transparent films commonly comprise transparent plates having a conducting (or conductive) layer provided thereon. The transparent plates can comprise glass, plastic, or other suitable material substrates.

Two basic approaches exist to forming a transparent conducting film. In as first approach for forming a transparent conducting film, a wide bandgap semiconductor material is used for the conducting layer. Such semiconductor material ma be for example, indium tin oxide ("ITO"). The semiconductor material can be deposited uniformly as a thin film by processes such as sputter deposition. A second approach for forming a transparent conducting film involves forming a biphasic system comprising a low loading of an opaque conductor in a transparent, insulating matrix. Commonly, carbon nanotubes are used as an opaque conductor because of their high inherent conductivity and their high aspect ratio, both of which facilitate contact between one tube and another, even along a large distance.

In a conventional bundle of carbon nanotubes (CNTs) provided on a substrate, as tube loading, increases, the number of tube-tube contacts increases. At the same time however, the transparency of the conductive layer and of the film decreases.

BRIEF DESCRIPTION OF THE FIGURES

The foregoing and other features of the present disclosure will become more fully apparent from the following description and appended claims, taken in conjunction with the accompanying drawings. Understanding that these drawings depict only several examples in accordance with the disclosure and are, therefore, not to be considered limiting of its scope, the disclosure will be described with additional specificity and detail through use of the accompanying drawings, in which:

DETAILED DESCRIPTION

Figure 1:
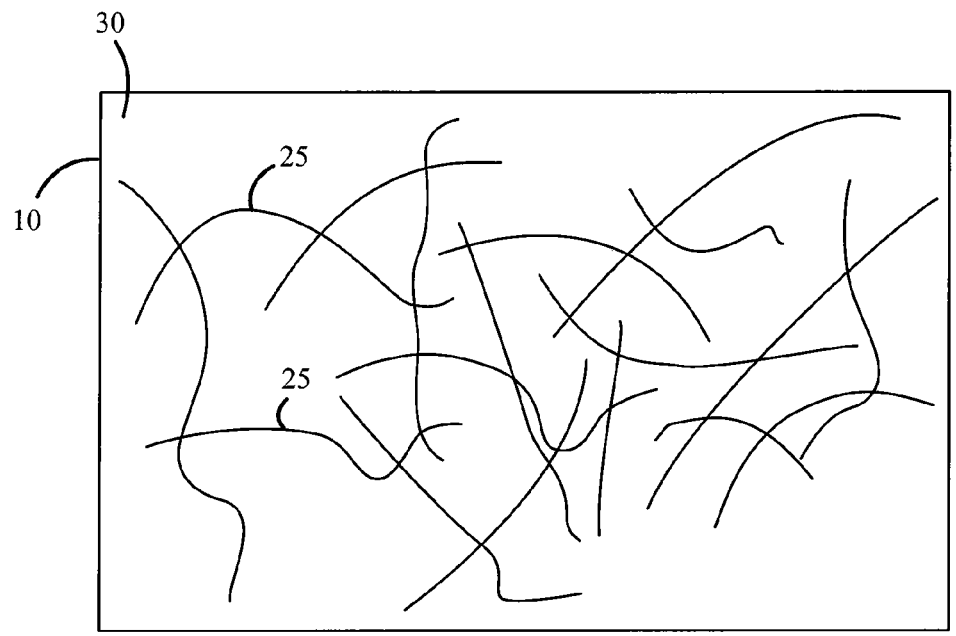
FIG. 1 depicts a substrate having silica nanoparticles deposited thereon, in accordance with some examples provided herein.

In the following detailed description, reference is made to the accompanying drawings, which form a part hereof. In the drawings, similar symbols typically identify similar components, unless context dictates otherwise. The illustrative examples described in the detailed description, drawings, and claims are not meant to be limiting. Other examples may be utilized, and other changes may be made, without departing from the spirit or scope of the subject matter presented herein. It will he readily understood that the aspects of the present disclosure, as generally described herein, and illustrated in the figures, can be arranged, substituted, combined, separated, and designed in a wide variety of different configurations, all of which are implicitly contemplated herein.

Illustrative examples herein describe transparent films comprising, a substrate and a conductive layer formed of carbon nanotubes and silica nanoparticles, and methods of manufacturing such transparent films. Many other examples are also possible, but time and space limitations prevent including an exhaustive list of those examples in one document. Accordingly, other examples within the scope of the claims will become apparent to those skilled in the art from the teachings of the present disclosure.

The conductivity of nanotube films may be improved by casting bundles of nanotubes instead of dispersions of soluble tubes, but it is difficult to cast uniform thin films using such an approach. By using bundles of nanotubes, tubes in the bundle may have multiple opportunities to contact one another. A method may be arranged to aggregate nanotubes into bundles that may be casted as thin films.

Figure 2:
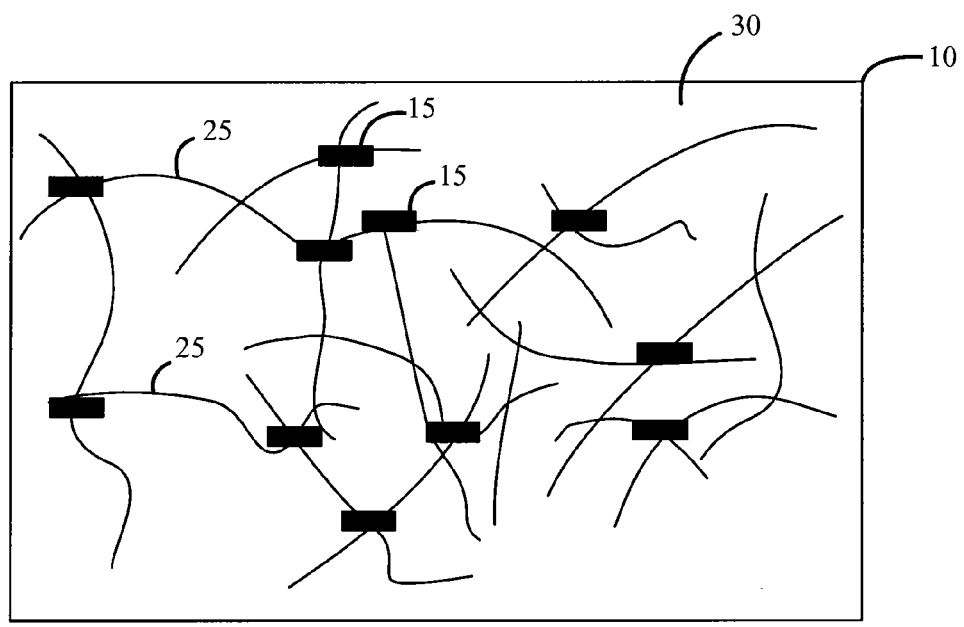
FIG. 2 depicts a transparent film formed by depositing carbon nanotubes on the substrate of FIG. 1, in accordance with some examples provided herein.

FIG. 1 depicts a substrate 10 having silica nanoparticles 25 deposited thereon, in accordance with some examples of the present disclosure. FIG. 2 depicts a transparent film formed by depositing carbon nanotubes 15 on the substrate 10 of FIG. 1, in accordance with some examples of the present disclosure. Accordingly, as shown, the transparent film may include a substrate 10, including a surface 30, carbon nanotubes 15, and silica nanoparticles 25.

In various implementations, the substrate 10 may be as transparent substrate and may comprise glass, plastic or other suitable materials. A templating layer may be provided on the surface 30 of the substrate 10. The templating layer may comprise, for example, silica nanoparticles 25. In examples where the templating agent comprises silica nanoparticles, the silica nanoparticles may be provided as a network or dispersion. In various implementations, the silica nanoparticles 25 may be provided in as random distribution. An intermediate layer (not shown) may also be provided between the substrate 10 and the layer of silica nanoparticles 25 to associate the silica nanoparticles with the surface 30 of the substrate 10.

To form a transparent film, a conductive layer may he formed on a surface 30 of the substrate 10. The conductive layer may be formed of a conductive material such as carbon nanotubes 15. The carbon nanotubes 15 may provided over a templating layer, such as that provided by the silica nanoparticles 25. The carbon nanotubes 15 thus may be associated with the silica nanoparticles 25. As shown in FIG. 2, bundles of carbon nanotubes 15 may be provided on the surface 30 of the substrate 10 by association with the silica nanoparticles 25.

The silica nanoparticles 25 may act as a templating agent that may increase the alignment of the carbon nanotubes 15 along nanoscopic segments of the carbon nanotubes, thus allowing increased metal-metal tube contact. Increased metal-metal tube conductivity in turn increases the conductivity along the substrate 10. The silica nanoparticles 25 may increase the conductivity of the transparent film, which may result in an increase in transparency of the transparent film. Because of the increased conductivity, a lesser amount of carbon nanotubes may be used for a transparent film than were used on substrates in the prior art. Accordingly, a transparent film having enhanced conductivity and increased transparency may be provided.

The silica nanoparticles 25 may be provided as elongated silica nanoparticles, which may range between approximately 100 nm and approximately 200 nm in length, and may be approximately 10 nm in diameter, although other lengths and diameters are possible. In some examples, the surface of the silica nanoparticles may also be modified with adhesion promoters (e.g., epoxy resin). Such modification may enhance the association of the silica particles with the substrate 10.

Commercially available elongated silica particles may be used, such as Nissan Chemical Company's Snowtex-UP® or Snowtex-PS®, to template the formation of carbon nanotube bundles. Snowtex-UP® is as dispersion of silica particles with diameters of 10-15 nm and aspect ratios from 5:1 to 10:1. Relative to carbon nanotubes, these materials may be inexpensive and easier to process, and have excellent reproducibility.

Figure 3:
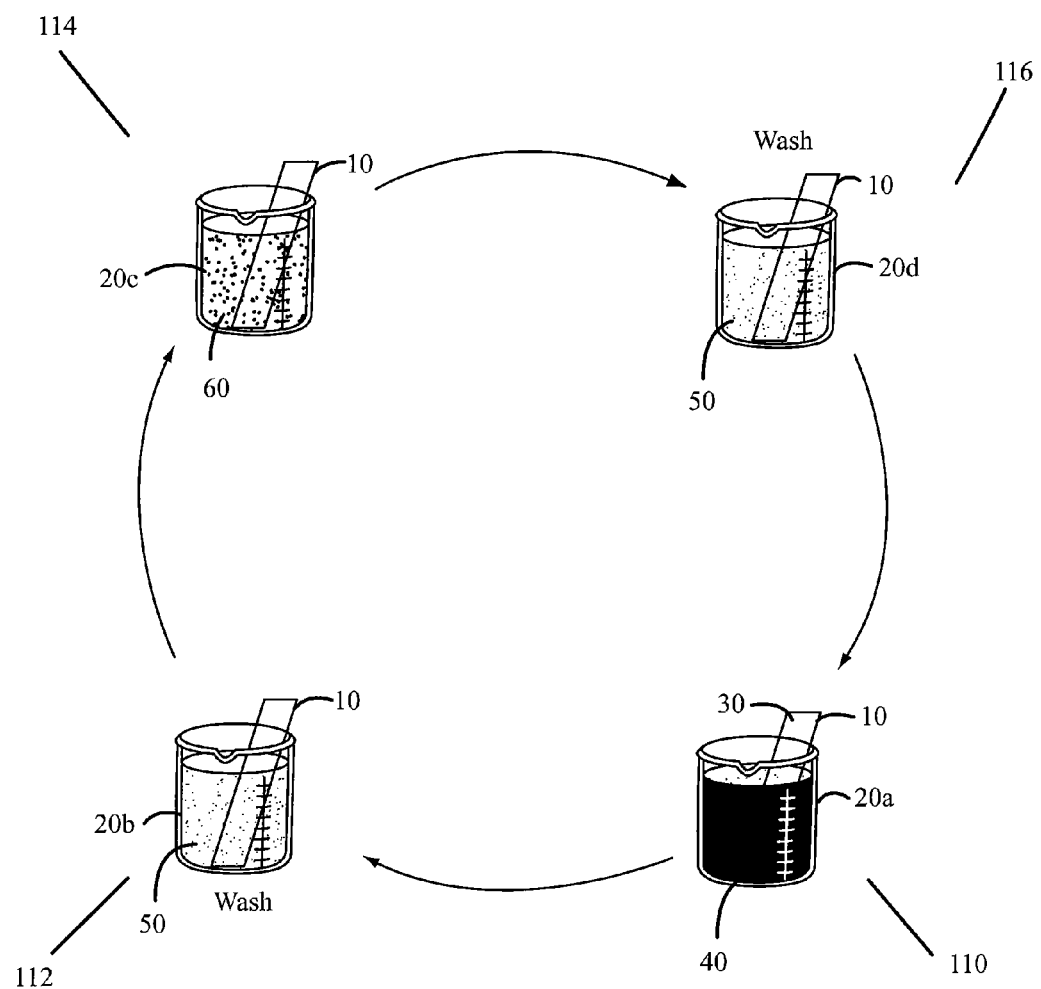
FIG. 3 depicts forming a transparent film in accordance with an example method provided herein.

FIG. 3 depicts forming a transparent film in accordance with at least some example methods of the present disclosure. The transparent film may be an electrically conductive film comprising the silica nanoparticles and carbon nanotubes. In the example shown, carbon nanotubes 15 with a cationic surfactant may be adhered to anionic silica nanoparticles 25 by electrostatic self-assembly. FIG. 3 includes numbering to designate illustrative components of examples shown within the drawings, including the following: a substrate 10, carbon nanotubes 15, silica nanoparticles 25, a surface 30 of the substrate 10, containers 20(*a*)-20(*d*), a polycation solution 40, water 50, and a polyanionic solution 60. Generally, providing silica nanoparticles on a substrate is shown at 110, washing the substrate in a solution is shown at 112, providing carbon nanotubes on the substrate is shown at 114, and washing the substrate in a solution is shown at 116. It is to be appreciated that, while FIG. 3 specifically illustrates formation of a transparent film using silica nanoparticles as a templating agent and carbon nanotubes as a conductive material, other templating agents and/or other conductive materials may be used.

As shown at 110, a random network of silica nanoparticles (or other templating agent) may he provided on a substrate 10. In some examples, the silica nanoparticles may be provided by a method such as spin-coating. Spin-coating is a procedure that may be used to apply uniform thin films to substantially flat substrates where an excess amount of a solution may be placed on a substrate, and the substrates may then be rotated at high speed in order to spread the fluid by centrifugal force. In this procedure, a substrate 10 may be dipped into an organic solvent such as water or other suitable material containing the silica nanoparticles. The substrate may then be placed inside a machine used for spin coating, called a spin coater, or a spinner, where it is rotated. Rotation may he continued while the fluid spins off the edges of the substrate 10, until as desired thickness of as film on top of the substrate may be achieved. The organic solvent may be volatile, thus evaporating during spinning. A higher angular speed during spinning, may achieve a thinner film on the substrate. The thickness of the film may also depend on the concentration of the solution and the solvent. The silica nanoparticles 25 may be accompanied by a binder in order to prevent aggregation of the silica nanoparticles. The binder is added to the silica nanoparticles before providing the silica nanoparticles on the surface of the substrate. This binder may subsequently be removed after providing the silica nanoparticles on the surface of the substrate by as step such as thermal treatment, chemical etch, or solvent.

Alternatively, the silica nanoparticles 25 may be associated with a substrate 10 by dip coating, using a method such as electrostatic self-assembly. In dip coating, the substrate 10 can be immersed into a tank or container containing, a coating material, such as a solvent and the silica particles, removing the substrate 10 from the tank, and allowing it to drain. The coated substrate can then be dried by air drying, force-drying or baking.

In electrostatic self-assembly, the silica nanoparticles may be provided in a polycation solution 40, which can comprise water or other organic solvents. Initially, the substrate 10 has a negative charge and is then inserted into a tank or container 20*a* with the polycation solution 40. The silica nanoparticles 25 in the polycation solution 40 can adhere to the surface 30 of the substrate 10. Generally, as shown at 112, the substrate 10 may then be removed from the container 20*a*, and can be washed in water 50 or some other suitable solution in another container 20*b* to rinse the polycation solution 40 off the substrate 10.

As shown at 114, the substrate 10 may be removed from the container 20*b*, and inserted into a container 20*e* having a polyanionic solution 60. The polyanionic solution contains carbon nanotubes 15 for other conductive material). Due to the opposite charge between the silica nanoparticles 25 and the carbon nanotubes in the polyanionic solution 60, the carbon nanotubes 15 may attach to the surface of the substrate 10 with the silica nanoparticles 25. The carbon nanotubes 15 may naturally tend to align with the silica nanoparticles 25 due to an aspect ratio of the silica nanoparticles 25. Multiple carbon nanotubes 15 may align with each silica nanoparticle 25 because the diameter of the silica nanoparticles 25 is an order of magnitude greater than that of the carbon nanotubes. The substrate 10 may then be removed from the container 20*c*, and may be washed in container 20*d* with water 50 or other solution as shown at 116 to rinse the polyanionic solution 60 off the substrate.

When using electrostatic self-assembly for both deposition of the templating agent and deposition of the conductive material, the process may be repeated to make a film that is sufficiently thick to have good surface conductivity, as each individual step may only build a few nanometers of film at a time. Thus, the process shown in FIG. 3 may be repeated several times. Each dip coat may add a layer of thickness in a range of approximately 0.5 nm to approximately 2 nm. The film, comprising the templating agent and the conductive material, may in some examples have a thickness in a range of approximately 10 nm to approximately 20 nm, which may take approximately 5-20 dip coats, which may be varied.

Figure 4:
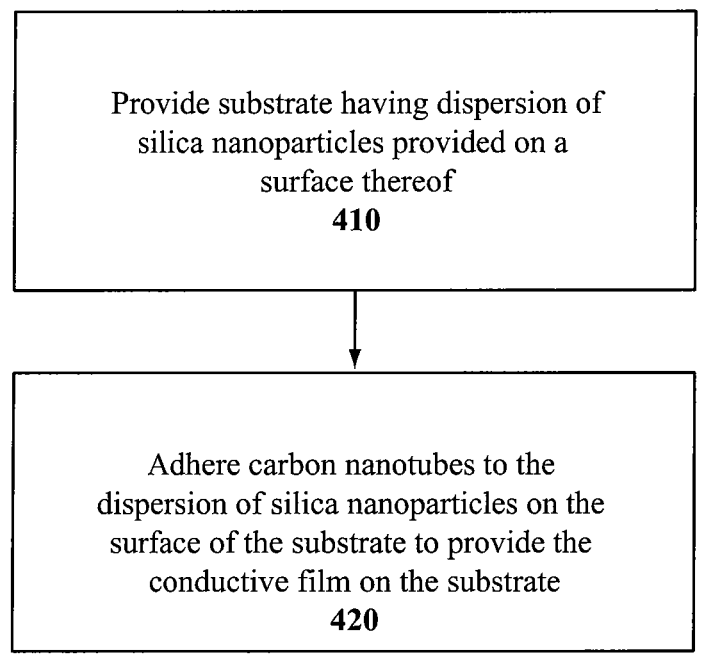
FIG. 4 depicts a flow diagram illustrating a method of forming a transparent film comprising a substrate and a conductive material, in accordance with some examples provided herein.

FIG. 4 depicts a flow diagram a method. of forming a transparent film comprising a substrate and a conductive material, in accordance with some examples of the present disclosure. FIG. 4 includes numbering to designate illustrative components of examples shown within the drawings, including various operations for forming the transparent film as illustrated by blocks 410 and 420.

Initially, as shown at block 410, a substrate may be provided having a dispersion of silica nanoparticles provided on a surface thereof. In some examples, an alternative templating agent may be provided on the surface. As shown at block 420, carbon nanotubes may adhere to the dispersion of silica nanoparticles on the surface of the substrate to provide a conductive film on the substrate. In some examples, an alternative conductive material may be adhered dispersion of silica nanoparticles (or other templating agent). While adherence is specifically described, other manners of associating the conductive material with the templating agent may alternatively be used.

Figure 5:
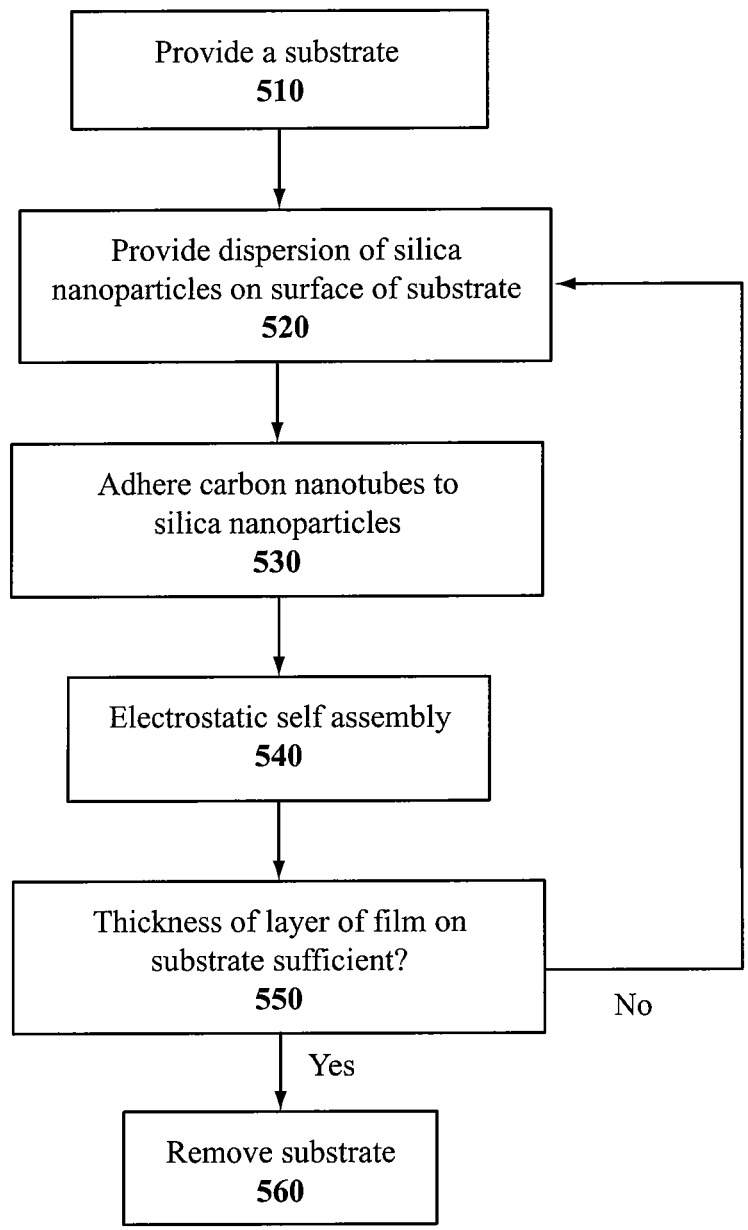
FIG. 5 depicts a flow diagram illustrating an additional example methods of forming a transparent film comprising a substrate and a conductive material, in accordance with some examples provided herein.

FIG. 5 depicts a flow diagram illustrating an additional example methods of forming, a transparent film comprising a substrate and a conductive material, in accordance with some examples of the present disclosure. FIG. 5 includes numbering to designate illustrative components of examples shown within the drawings, including operations for forming the transparent film as illustrated by blocks 510, 520, 530, 540, 550 and/or 560.

Initially, as shown at block 510, a substrate may be provided. A dispersion of silica nanoparticles may be provided on a surface of the substrate at block 520, as described above. In other examples, an alternative templating agent may be provided on the surface of the substrate. As shown at block 530, carbon nanotubes can adhere to the silica nanoparticles, for example by electrostatic self assembly. In some examples, an alternative conductive material may be adhered dispersion of silica nanoparticles (or other templating agent). While adherence is specifically described, other manners of associating the conductive material with the templating agent may alternatively be used. As shown at block 550, the process may determine if the thickness of the film layer on the surface of the substrate is sufficient, which can be predetermined based on the use of the substrate. Such determination may be done manually or via computer implementation. If the thickness is determined as sufficient, the transparent film is complete and the substrate may be removed. If the thickness is determined as not sufficient, the process can be repeated and silica nanoparticles are again placed on the surface of the substrate at block 520.

Figure 6:
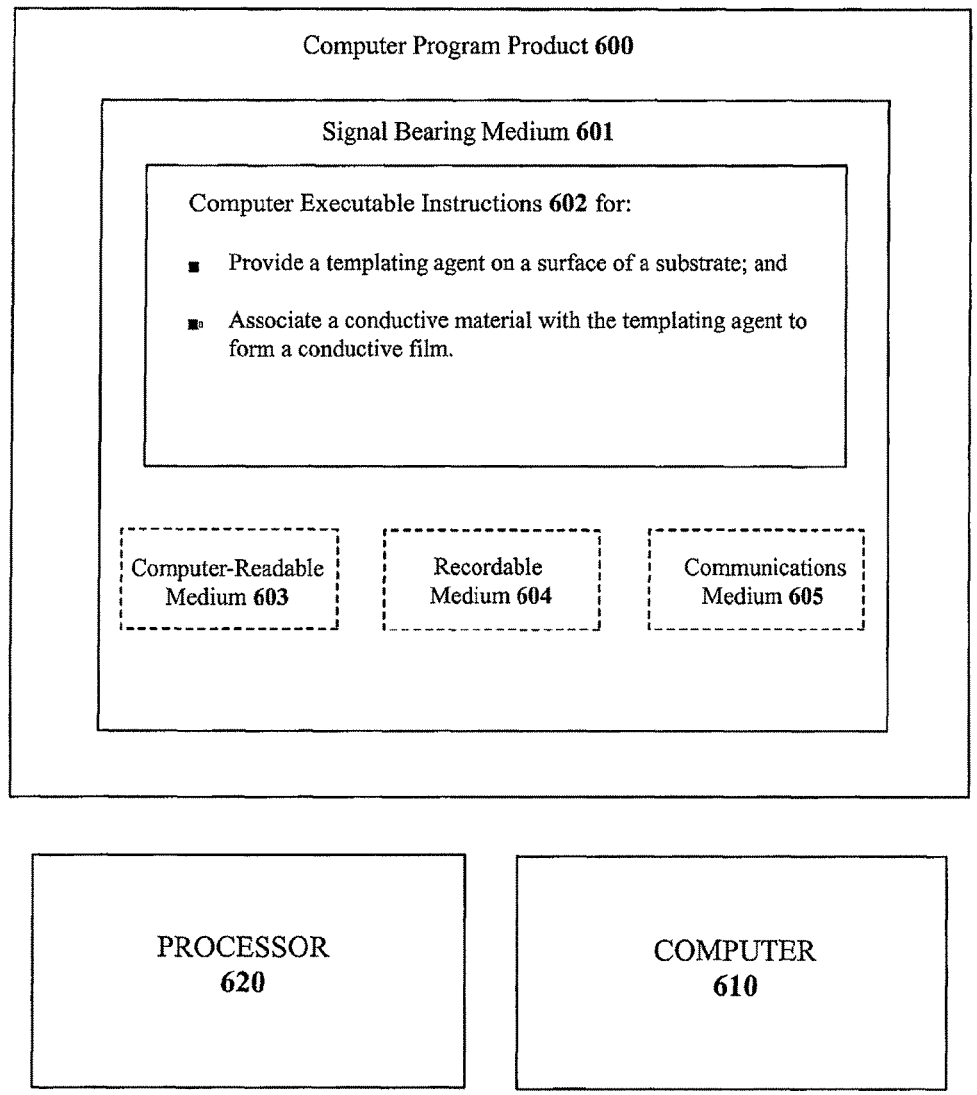
FIG. 6 illustrates a block diagram of an example computer program product, all arranged in accordance with at least some examples of the present disclosure.

FIG. 6 illustrates a block diagram of an example computer program product 600, a computer 610 and a processor 620 in accordance with at least some examples of the present disclosure. In some examples, as shown in FIG. 6, computer program product 600 includes a signal bearing medium 601 that may also include computer executable instructions 602. Computer executable instructions 602 may be arranged to provide instructions for forming a conductive film. Such instructions may include, for example, instructions relating to providing a templating agent on a surface of a substrate. Such instructions further may include, for example, instructions relating to associating a conductive material with the templating agent to form a conductive film. Generally, the computer executable instructions 602 may include instructions for performing any steps of the method for forming a conductive film described herein. The instructions are executable by the processor 620, which may be a part of the computer 610.

Also depicted in FIG. 6, in some examples, a computer program product 600 may include one or more of computer executable instructions 602, a computer readable medium 603, a recordable medium 604 and a communications medium 605. The dotted boxes around these elements may depict different types of mediums that may be included within, but not limited to, signal bearing medium 601. These types of mediums may distribute programming instructions 602 to be executed by a computer processor 620 of computer 610, or other computer devices including processors, logic and/or other facility for executing such instructions. Computer readable medium 603 and recordable medium 604 may include, but are not limited to, a flexible disk, a hard disk drive (HDD), a Compact Disc (CD), a Digital Video Disk (DVD), a digital tape, a computer memory, etc. Communications medium 605 may include, but is not limited to, a digital and/or an analog communication medium (e.g., a fiber optic cable, a waveguide, a wired communication link, a wireless communication link, etc.).

The surface of the templating agent, such as silica nanoparticles, may be modified to create materials that vary significantly in solubility and chemical reactivity. Such modification may be made to improve processability, substrate-silica binding, and/or to improve the interaction of the silica with nanotubes.

Transparent films formed in accordance with the examples described herein may include a conductive material templated by a templating agent. In specific examples described, transparent films may comprise bundles of carbon nanotubes templated by the elongated silica particles. For a given level of transparency, the conductivity of such films may be improved relative to the state of the art today. By aligning the carbon nanotubes in the manners described in the present disclosure, the chances of a metal-metal tube intersection is significantly increased. Using a bundle of carbon nanotubes with the elongated silica nanoparticles as a templating agent may allow sufficient high quality metal-metal tube contacts to sustain a percolation path across the surface of the substrate, using a minimum number of tubes.

The transparency for the substrate formed by methods described herein may be approximately 85% or better, thus enhancing conductivity without sacrificing transparency. The number of bundles of carbon nanotubes and silica nanoparticles may be selected so as to maximize the conductivity without sacrificing transparency, and keeping transparency above approximately 85%, and even above approximately 90%.

The various aspects, features or implementations of examples of the present disclosure described herein can be used alone or in various combinations. The method examples of the present disclosure can be implemented by software, hardware or a combination of hardware and software (e.g., software stored on a computer-accessible medium).

The present disclosure is not to be limited in terms of the particular examples described in this application, which are intended as illustrations of various aspects. Many modifications and examples can be made without departing, from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and examples are intended to fall within the scope of the appended claims. The present disclosure is to be limited only by the terms of the appended claims, along with the full scope of equivalents to which such claims are entitled. It is to be understood that this disclosure is not limited to particular devices, methods, systems, which can, of course vary. It is also to be understood that the terminology used herein is for the purpose of describing particular examples only, and is not intended to be limiting.

The foregoing describes various examples of transparent films used for nanowiring and methods for forming nanowires on a substrate. Following are specific examples of methods and transparent films thereof These are for illustration only and are not intended to be limiting. The present disclosure generally relates to a method for forming as transparent film for nanowiring.

Some examples include transparent films comprising substrates with bundles of carbon nanotubes and silica nanoparticles may be provided as a templating agent to allow more metal-metal tube contacts for improving the conductivity of the transparent film. By using silica nanoparticles, uniform bundles of carbon nanotubes may be prepared that maintain much of the optical advantages of singulated nanotubes, but with improved conductivity. The transparent films may then be used for a wide variety of applications as transparent conductive films for the solar cell and flat panel display markets, as well as other similar applications.

Provided and described herein is an example method for forming a conductive film, the method comprising providing a substrate, providing a templating agent on a surface of the substrate, and associating as conductive material with the templating agent to form the conductive film. In some examples, the conductive material may comprise carbon nanotubes and the templating agent can comprise silica nanoparticles. In some examples, providing the templating agent comprises providing a dispersion of silica nanoparticles on the surface of the substrate. The silica nanoparticles may provide for a greater number of tube to tube contacts between the carbon nanotubes to increase conductivity of the conductive film. The silica nanoparticles may be disposed on the surface of the substrate in a random network arrangement. The silica nanoparticles may be provided on the surface of the substrate by one or more of spin-coating, dip coating, or dip coating by electrostatic self assembly.

Some methods may further comprise adding a binder to the silica nanoparticles before providing the silica nanoparticles on the surface of the substrate, and removing the binder after providing the silica nanoparticles on the surface of the substrate. The carbon nanotubes may be adhered to the silica nanoparticles by electrostatic self-assembly. The silica nanoparticles may be anionic. Some methods may further comprise adding a cationic surfactant to the carbon nanotubes. The silica nanoparticles may have a length in as first range from approximately 100 nanometers to approximately 200 nanometers and the carbon nanotubes may have a length in a second range from approximately 1 micron to approximately 2 microns. The substrate may comprise one or more of glass, and/or a material with a transparency greater than approximately 85%, in some examples.

Also provided and described herein, for example, is a conductive film comprising a substrate, and an electrically conductive film comprising silica nanoparticles dispersed on a surface of the substrate, and carbon nanotubes adhered to the silica nanoparticles on the surface of the substrate. The silica nanoparticles may be elongated silica nanoparticles, and may be dispersed in a random network on the surface of the substrate. Multiple carbon nanotubes may adhere to each silica nanoparticle.

Also provided, and described herein, for example, are computer accessible mediums having stored thereon computer executable instructions for forming a conductive film, the forming comprising providing a templating agent on as surface of a substrate, and associating a conductive material with the templating agent to form the conductive film. The templating agent may comprise silica nanoparticles, and the conductive material may comprise carbon nanotubes.

With respect to the use of substantially any plural and/or singular terms herein, those having skill in the art can translate from the plural to the singular and/or from the singular to the plural as is appropriate to the context and/or application. The various singular/plural permutations may be expressly set firth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.), It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more") the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood b those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters. fifths, tenths, etc. As a non-limiting example, each range discussed herein can be readily broken down into a lower third, middle third and upper third, etc. As will also he understood by one skilled in the art all language such as "up to," "at least," "greater than," "less than," and the like include the number recited and refer to ranges which can be subsequently broken down into sub-ranges as discussed above. Finally, as will he understood by one skilled in the art, a range includes each individual member.

While various aspects and examples have been disclosed herein, other aspects and examples will be apparent to those skilled in the art. The various aspects and examples disclosed herein are for purposes of illustration and are not intended to be limiting, with the true scope and spirit being indicated by the following claims.

What is claimed is:

1. An apparatus including a conductive film, the apparatus comprising:
    a transparent substrate and
    a conductive film comprising:
        a first layer including a plurality of anionic elongated silica nanopartie es dispersed on a surface of the transparent substrate; and
        a second layer including a plurality of carbon nanotulles aligned with the silica nanopartieles along nanoscopic segments of the carbon nanotubes, wherein a cationic surfactant attached to the carbon nanotubes is adhered to the anionic elongated silica nanoparticles.

2. The apparatus of claim 1, wherein the elongated silica nanoparticles are arranged randomly on the surface of the substrate.

3. The apparatus of claim 1, wherein the elongated silica nanoparticles have a length from approximately 100 nanometers to approximately 200 nanometers.

4. The apparatus of claim 3, wherein the elongated silica nanoparticles have a diameter of approximately 10 nanometers.

5. The apparatus of claim 1, wherein the conductive film has a thickness of approximately 10 nanometers to approximately 20 nanometers.

6. The apparatus of claim 1., wherein the conductive film includes a plurality of layers comprising first and second layers, each layer of the plurality of layers having a thickness of approximately 0.5 nanometers to approximately 2 nanometers.

7. The apparatus of claim 1, wherein the elongated silica nanoparticles are configured to increase the conductivity of the conductive film.

8. The apparatus of claim 7, wherein a transparency of the conductive film is configured to increase in response to an increase in its conductivity.

9. The apparatus of claim 1, wherein intersections of the carbon nanotubes are configured to sustain a percolation path across the surface of the transparent substrate.

10. A conductive film, comprising:
    elongated silica nanoparticles dispersed on a surface of a transparent substrate; and
    carbon nanotubes adhered to at least some of the elongated silica nanoparticles, the carbon nanotubes aligned with the elongated silica nanoparticles along a direction of elongation of the silica nanoparticles, wherein a cationic surfactant attached to the plurality of carbon nanotubes is adhered to the anionic elongated silica nanoparticles.

11. The conductive film of claim 10, wherein the carbon nanotubes are adhered to the elongated silica nanoparticles by electrostatic self-assembly.

12. The conductino, film of claim 10, wherein at least some of the elongated silica nanoparticles include bundles of carbon nanotubes adhered thereto.

13. The conductive film of claim 10 wherein the elongated silica nanoparticles have a length in a first range from approximately 100 nanometers to approximately 200 nanometers, and the carbon nanotubes have a second length in a second range from approximately 1 micron to approximately 2 microns.

14. The conductive film of claim 10, wherein the elongated silica nanoparticles are dispersed. in a random network on the surface of the substrate.

15. The conductive film of claim. 10, wherein the substrate comprises a material with a transparency greater than approximately 85%.

16. The apparatus of claim 10, wherein the conductive film comprises metal-metal tube contacts configured to sustain a percolation path across the surface of the transparent substrate.

17. A solar cell including the conductive film of claim 10.

18. An apparatus comprising:
    a transparent substrate; and
    a transparent conductive film including:
        anionic elongated silica nanoparticles dispersed on a surface of the substrate; and
        carbon nanotubes adhered to at least some of the anionic elongated silica nanoparticles using a cationic surfactant, wherein the carbon nanotubes are aligned with the anionic elongated silica nanoparticles.

19. The apparatus of claim 18, vberein the elongated silica nanoparticles are dispersed in a random network to define first regions of the substrate having elongated silica nanopartieles thereon, the substrate further comprising second regions interspersed with the first regions, the second regions substantially free from elongated silica nanoparticles.

20. The apparatus of claim 19, wherein substantially all of the carbon nanotubes are confined to the first regions.

21. The apparatus of claim 18, wherein the carbon nanotubes are adhered to the elongated silica nanoparticles by electrostatic self-assembly.

22. The apparatus of claim 18, wherein the elongated silica nanoparticles have an aspect ratio ranging from 5:1 to 10:1.

23. The apparatus of claim 18, wherein a diameter of the silica nanoparticle is an order of magnitude greater than a diameter of the carbon nanotubes.

24. A flat panel display including the apparatus of claim 18.

* * * * *

UNITED STATES PATENT AND TRADEMARK OFFICE
CERTIFICATE OF CORRECTION

PATENT NO. : 8,822,026 B2
APPLICATION NO. : 13/857874
DATED : September 2, 2014
INVENTOR(S) : Seth Adrian Miller Page 1 of 3

It is certified that error appears in the above-identified patent and that said Letters Patent is hereby corrected as shown below:

On the Title Page, in Item (73), under "Assignee", in Column 1, Line 1, delete "Emprie" and insert -- Empire --, therefor.

On the Title Page, in Item (56), under "OTHER PUBLICATIONS", in Column 2, Line 4, delete "Nonofibre" and insert -- Nanofibre --, therefor.

In the Specification

In Column 1, Line 24, delete "In as" and insert -- In a --, therefor.

In Column 1, Line 27, delete "ma be" and insert -- may be, --, therefor.

In Column 1, Line 38, delete "loading," and insert -- loading --, therefor.

In Column 1, Line 39, delete "same time" and insert -- same time, --, therefor.

In Column 2, Line 18, delete "will he" and insert -- will be --, therefor.

In Column 2, Line 24, delete "comprising," and insert -- comprising a --, therefor.

In Column 2, Line 48, delete "may be as" and insert -- may be a --, therefor.

In Column 2, Line 56, delete "in as" and insert -- in a --, therefor.

In Column 2, Line 61, delete "may he" and insert -- may be --, therefor.

In Column 3, Line 29, delete "is as" and insert -- is a --, therefor.

Signed and Sealed this
Eighteenth Day of August, 2015

Michelle K. Lee
*Director of the United States Patent and Trademark Office*

CERTIFICATE OF CORRECTION (continued)
U.S. Pat. No. 8,822,026 B2

In Column 3, Line 56, delete "may he" and insert -- may be --, therefor.

In Column 3, Line 67, delete "may he" and insert -- may be --, therefor.

In Column 4, Line 2, delete "until as" and insert -- until a --, therefor.

In Column 4, Line 2, delete "of as" and insert -- of a --, therefor.

In Column 4, Line 5, delete "spinning," and insert -- spinning --, therefor.

In Column 4, Line 13, delete "by as" and insert -- by a --, therefor.

In Column 4, Line 18, delete "containing," and insert -- containing --, therefor.

In Column 4, Line 35, delete "20e" and insert -- 20c --, therefor.

In Column 4, Line 37, delete "15 for" and insert -- 15 (or --, therefor.

In Column 4, Line 63, delete "method." and insert -- method --, therefor.

In Column 5, Line 6, delete "may he" and insert -- may be --, therefor.

In Column 5, Line 6, delete "may he" and insert -- may be --, therefor.

In Column 5, Line 16, delete "forming," and insert -- forming --, therefor.

In Column 6, Line 16, delete "may he" and insert -- may be --, therefor.

In Column 6, Line 44, delete "can he" and insert -- can be --, therefor.

In Column 6, Line 50, delete "departing," and insert -- departing --, therefor.

In Column 6, Line 61, delete "of course" and insert -- of course, --, therefor.

In Column 6, Line 67, delete "thereof These" and insert -- thereof. These --, therefor.

In Column 7, Line 2, delete "forming as" and insert -- forming a --, therefor.

In Column 7, Line 18, delete "associating as" and insert -- associating a --, therefor.

In Column 7, Line 40, delete "in as" and insert -- in a --, therefor.

In Column 7, Line 42, delete "nanometer and" and insert -- nanometer, and --, therefor.

CERTIFICATE OF CORRECTION (continued)

In Column 7, Line 56, delete "provided," and insert -- provided --, therefor.

In Column 7, Line 59, delete "on as" and insert -- on a --, therefor.

In Column 8, Line 2, delete "set firth" and insert -- set forth --, therefor.

In Column 8, Line 9, delete "etc.)," and insert -- etc.). --, therefor.

In Column 8, Line 24, delete "more")" and insert -- more"); --, therefor.

In Column 8, Line 46, delete "understood b" and insert -- understood by --, therefor.

In Column 8, Line 65, delete "quarters." and insert -- quarters, --, therefor.

In Column 9, Line 1, delete "also he" and insert -- also be --, therefor.

In Column 9, Line 5, delete "will he" and insert -- will be --, therefor.

In the Claims

In Column 9, Line 18, in Claim 1, delete "substrate" and insert -- substrate; --, therefor.

In Column 9, Line 21, in Claim 1, delete "nanopartie es" and insert -- nanoparticles --, therefor.

In Column 9, Line 23, in Claim 1, delete "nanotulles" and insert -- nanotubes --, therefor.

In Column 9, Line 24, in Claim 1, delete "nanopartieles" and insert -- nanoparticles --, therefor.

In Column 9, Line 40, in Claim 6, delete "claim 1.," and insert -- claim 1, --, therefor.

In Column 10, Line 10, in Claim 12, delete "conductino," and insert -- conducting --, therefor.

In Column 10, Line 13, in Claim 13, delete "claim 10" and insert -- claim 10, --, therefor.

In Column 10, Line 19, in Claim 14, delete "dispersed." and insert -- dispersed --, therefor.

In Column 10, Line 21, in Claim 15, delete "claim." and insert -- claim --, therefor.

In Column 10, Line 24, in Claim 16, delete "apparatus" and insert -- conductive film --, therefor.

In Column 10, Line 38, in Claim 19, delete "vberein" and insert -- wherein --, therefor.